United States Patent
Yu et al.

(10) Patent No.: US 10,636,802 B2
(45) Date of Patent: Apr. 28, 2020

(54) TWO-TERMINAL NON-VOLATILE MEMRISTOR AND MEMORY

(71) Applicant: Research & Business Foundation Sungkyunkwan University, Suwon-si (KR)

(72) Inventors: Woo Jong Yu, Suwon-si (KR); Ui Yeon Won, Ansan-si (KR); Vu Quoc An, Suwon-si (KR)

(73) Assignee: Research & Business Foundation Sungkyunkwan University, Suwon-si (KR)

(*) Notice: Subject to any disclaimer, the term of this patent is extended or adjusted under 35 U.S.C. 154(b) by 0 days.

(21) Appl. No.: 16/215,900

(22) Filed: Dec. 11, 2018

(65) Prior Publication Data
US 2019/0189628 A1 Jun. 20, 2019

(30) Foreign Application Priority Data
Dec. 11, 2017 (KR) .................... 10-2017-0169634

(51) Int. Cl.
*H01L 27/11521* (2017.01)
*H01L 29/66* (2006.01)
*H01L 27/11526* (2017.01)
*G11C 16/26* (2006.01)
*G11C 16/10* (2006.01)
(Continued)

(52) U.S. Cl.
CPC ...... *H01L 27/11521* (2013.01); *G11C 13/025* (2013.01); *G11C 16/0408* (2013.01); *G11C 16/10* (2013.01); *G11C 16/14* (2013.01); *G11C 16/26* (2013.01); *H01L 27/11526* (2013.01); *H01L 29/1606* (2013.01); *H01L 29/66825* (2013.01); *H01L 29/78* (2013.01);
(Continued)

(58) Field of Classification Search
CPC ......... H01L 27/11517; H01L 27/11551; H01L 27/11521; H01L 29/42324; H01L 29/788; H01L 29/7887; H01L 29/66825; G11C 16/0408
See application file for complete search history.

(56) References Cited

U.S. PATENT DOCUMENTS 9,368,219 B1* 6/2016 Aritome ............. G11C 16/0408

FOREIGN PATENT DOCUMENTS

| KR | 10-2010-0025282 A | 3/2010 |
| KR | 10-2013-0140491 A | 12/2013 |
| KR | 10-2017-0096508 A | 8/2017 |

* cited by examiner

*Primary Examiner* — Hsien Ming Lee
(74) *Attorney, Agent, or Firm* — NSIP Law

(57) ABSTRACT

The present disclosure provides a vertical tunneling random access memory comprising: a first electrode disposed on a base substrate; a second electrode vertically spaced from the first electrode; a floating gate disposed between the first electrode and the second electrode and configured to charge or discharge charges; a tunneling insulating layer disposed between the first electrode and the floating gate; a barrier insulating layer disposed between the floating gate and the second electrode; a contact hole passing through the tunneling insulating layer and the barrier insulating layer for partially exposing the first electrode; a semiconductor pattern extending from the second electrode, along and on a portion of a side wall face defining the contact hole, to the first electrode such that one end of the semiconductor pattern is in contact with the first electrode and the other end of the pattern is in contact with the second electrode.

12 Claims, 10 Drawing Sheets

(51) Int. Cl.
*G11C 16/14* (2006.01)
*G11C 13/02* (2006.01)
*H01L 29/78* (2006.01)
*H01L 51/00* (2006.01)
*H01L 29/16* (2006.01)
*G11C 16/04* (2006.01)
H01L 29/788 (2006.01)
H01L 29/775 (2006.01)
H01L 29/06 (2006.01)

(52) U.S. Cl.
CPC ...... *H01L 51/0048* (2013.01); *H01L 29/0676* (2013.01); *H01L 29/775* (2013.01); *H01L 29/788* (2013.01)

FIG. 3
(a)
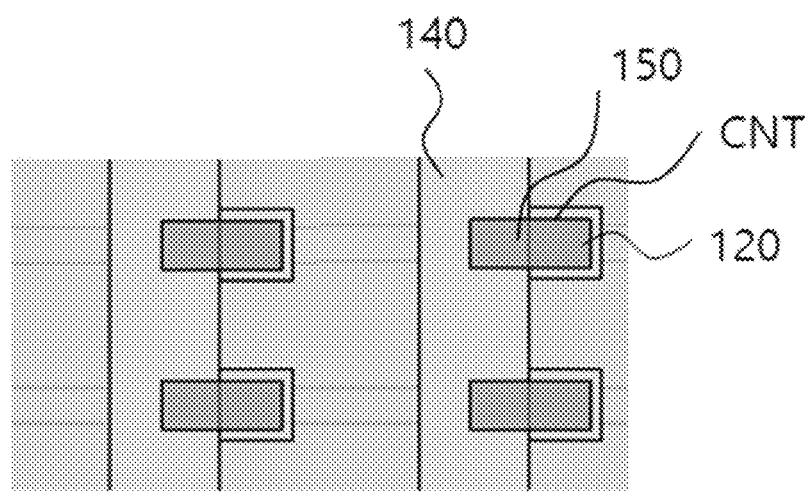
(b)
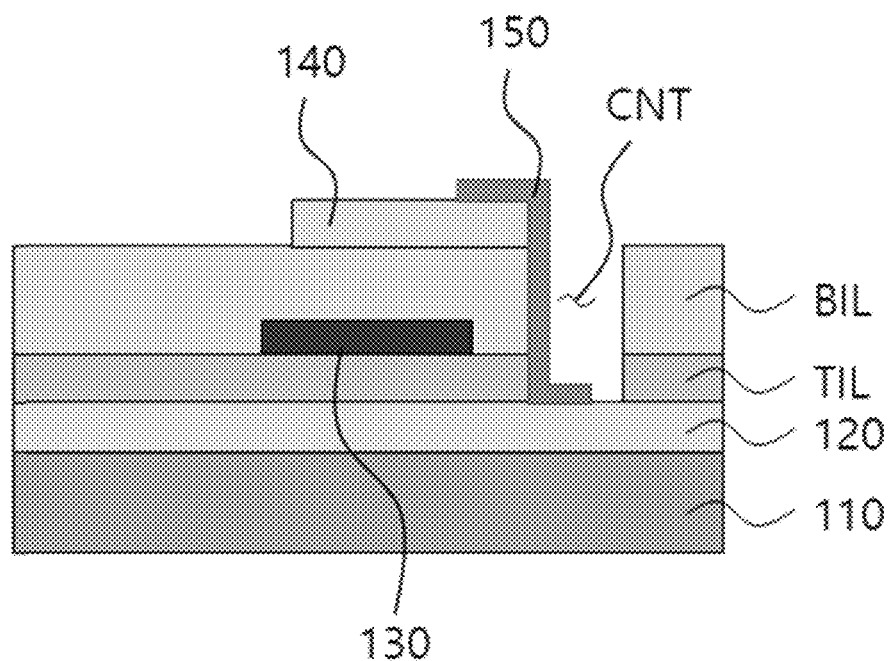

TWO-TERMINAL NON-VOLATILE MEMRISTOR AND MEMORY

CROSS-REFERENCE TO RELATED APPLICATIONS

This application claims the benefit under 35 USC 119(a) of Korean Patent Application No. 10-2017-0169634 filed on Dec. 11, 2017 in the Korean Intellectual Property Office, the entire disclosure of which is incorporated herein by reference for all purposes.

BACKGROUND

1. Field

The present disclosure relates to a vertical tunneling random access memory. More particularly, the present disclosure relates to a vertical tunneling random access memory capable of achieving high integration while ensuring operational reliability.

2. Description of Related Art

A flash memory as a type of a non-volatile memory can store information even when power supply thereto is terminated. The flash memory includes a gate insulator made of oxide and a gate electrode. There is a disadvantage in the flash memory in that a power consumption is high and it is difficult to integrate the flash memory in a vertical direction. Particularly, since the flexibility and the stretchability thereof are low, there is a limitation in application thereof to a wearable device. Further, recently, in a case of a synapse memory developed in connection with neuromorphic studies, there is a structural limitation that the memory requires two electrodes for operation.

In order to solve the above problems, memories composed of two electrodes based on a resistive memory (RRAM) using a material whose resistance changes, a phase change memory (PRAM) using a phase change of a material, and the like are introduced. However, the resistance memory or phase-change memory has a large difference in characteristics between each semiconductor devices, and has low operation reliability due to large change in electrical characteristics, and has large power loss in an off-state due to a very high off-current. To solve those problems, Korean Patent Application Publication No. 10-2017-0096508 (published on Aug. 24, 2014) discloses a horizontal tunneling random access memory (TRAM) which is a floating gate memory that operates with two electrodes. The TRAM may operate very stably like the conventional three-terminal floating gate to have an advantage of high reliability. However, in order to confine the charges in the floating gate or to remove the charges from the floating gate, a very high driving voltage must be applied to the TRAM having a structure in which the source and the drain are separated by 10 μm. Further, in the horizontal type structure, there is no intersection region between the semiconductor devices, such that high integration cannot be realized.

SUMMARY

This Summary is provided to introduce a selection of concepts in a simplified form that are further described below in the Detailed Description. This Summary is not intended to identify all key features or essential features of the claimed subject matter, nor is it intended to be used alone as an aid in determining the scope of the claimed subject matter.

One purpose of the present disclosure is to provide a vertical tunneling random access memory that can achieve high integration while ensuring operational reliability.

In a first aspect of the present disclosure, there is provided a vertical tunneling random access memory comprising: a first electrode disposed on a base substrate; a second electrode vertically spaced from the first electrode; a floating gate disposed between the first electrode and the second electrode and configured to charge or discharge charges; a tunneling insulating layer disposed between the first electrode and the floating gate; a barrier insulating layer disposed between the floating gate and the second electrode; a contact hole passing through the tunneling insulating layer and the barrier insulating layer for partially exposing the first electrode; a semiconductor pattern extending from the second electrode, along and on a portion of a side wall face defining the contact hole, to the first electrode such that one end of the semiconductor pattern is in contact with the first electrode and the other end of the pattern is in contact with the second electrode.

In one embodiment of the first aspect, the barrier insulating layer is thicker than the tunneling insulating layer such that electrons resulting from an application of a voltage to the first electrode tunnel through the tunneling insulating layer to the floating gate and are accumulated in the floating gate.

In one embodiment of the first aspect, a vertical spacing between the second electrode and the first electrode is smaller than or equal to 20 nm.

In one embodiment of the first aspect, in a write mode, the semiconductor pattern has a high resistance due to a negative field effect from electrons accumulated in the floating gate by a negative voltage applied to the first electrode and a positive voltage applied to the second electrode, wherein in a read mode, the memory is brought into an off state.

In one embodiment of the first aspect, in an erase mode, the semiconductor pattern has a low resistance due to a positive field effect from holes accumulated in the floating gate by a positive voltage applied to the first electrode and a negative voltage applied to the second electrode, wherein in a read mode, the memory is brought into an on state.

In one embodiment of the first aspect, the vertical tunneling random access memory further comprises word lines each of which extends in a first direction and bit lines each of which extends in a second direction crossing the first direction, wherein the word lines are arranged in the second direction and the bit lines are arranged in the first direction, wherein each first electrode, each second electrode, and each floating gate are disposed in each of intersecting regions between the word lines and the bit lines, wherein corresponding first and second electrodes are connected via a corresponding semiconductor pattern, wherein each first electrode is connected to each word line and acts as each drain electrode, and each second electrode is connected to each bit line and acts as each source electrode.

In one embodiment of the first aspect, the semiconductor pattern is made of one selected from a group consisting of molybdenum disulfide ($MoS_2$), tungsten diselenide ($WSe_2$), tungsten disulfide ($WS_2$), molybdenum diselenide ($MoSe_2$), silicon (Si), and germanium (Ge), zinc oxide (ZnO), indium-gallium-zinc oxide (IGZO), semiconducting carbon nanotubes (semiconducting CNT) and black phosphorous (BP).

In one embodiment of the first aspect, the tunneling insulating layer is made of one selected from a group consisting of hexagonal boron nitride (h-BN), aluminum oxide (Al2O$_3$), hafnium oxide (HfO$_2$) and silicon nitride.

In one embodiment of the first aspect, the floating gate is made of graphene.

In a second aspect of the present disclosure, there is provided a vertical tunneling random access memory comprising: a base substrate, wherein a horizontal plane of the base substrate is defined by a first direction and a second direction perpendicular to the first direction; first-direction extending electrode lines, wherein each of the first-direction extending electrode lines extends in the first direction, and the first-direction extending electrode lines are spacedly and vertically stacked; second-direction extending electrode lines, wherein each of the second-direction extending electrode lines extends in the second direction, and the second-direction extending electrode lines are spacedly and vertically stacked, wherein a corresponding second-direction extending electrode line is disposed between corresponding adjacent two first-direction extending electrode lines; and semiconductor devices, wherein each semiconductor device is disposed in an intersecting region between vertically adjacent first-direction extending and second-direction extending electrode lines, wherein each semiconductor device includes: a first electrode coupled to one of the vertically adjacent first-direction extending and second-direction extending electrode lines, wherein the one of the vertically adjacent first-direction extending and second-direction extending electrode lines has a lower vertical level than the other of the vertically adjacent first-direction extending and second-direction extending electrode lines; a second electrode vertically spaced from the first electrode, wherein the second electrode is coupled to the other of the vertically adjacent first-direction extending and second-direction extending electrode lines; a floating gate disposed between the first electrode and the second electrode and configured to charge or discharge charges; a tunneling insulating layer disposed between the first electrode and the floating gate; a barrier insulating layer disposed between the floating gate and the second electrode; a contact hole passing through the tunneling insulating layer and the barrier insulating layer for partially exposing the first electrode; a semiconductor pattern extending from the second electrode, along and on a portion of a side wall face defining the contact hole, to the first electrode such that one end of the semiconductor pattern is in contact with the first electrode and the other end of the pattern is in contact with the second electrode.

In one embodiment of the second aspect, vertically adjacent two first-direction extending electrode lines and a single second-direction extending electrode line between the vertically adjacent two first-direction extending electrode lines constitute two semiconductor devices sharing the single second-direction extending electrode line.

In one embodiment of the second aspect, a plurality of first-direction extending electrode lines are arranged in the second direction, a plurality of second-direction extending electrode lines are arranged in the first direction, and thus the semiconductor devices are arranged in a 3D configuration.

According to the vertical tunneling random access memory of the present disclosure, the vertical TRAM with a vertical spacing of 20 nm or smaller may be implemented. As a result, the driving voltage can be drastically reduced as compared with the horizontal TRAM in which the conventional drain-source spacing is 10 μm in the horizontal direction.

Further, since the vertical TRAM according to the present disclosure basically has a vertical structure, the TRAM may be manufactured in the form of an array of cross points between semiconductor devices, thereby improving integration. Further, the integration can be maximized by stacking the two-dimensional arrays of the vertical semiconductor devices three-dimensionally where each vertical semiconductor device has vertically spaced first and second electrodes.

BRIEF DESCRIPTION OF THE DRAWINGS

The accompanying drawings, which are incorporated in and form a part of this specification and in which like numerals depict like elements, illustrate embodiments of the present disclosure and, together with the description, serve to explain the principles of the disclosure.

FIG. 3 is an illustration of a vertical TRAM with a structure different from that of FIG. 1 and FIG. 2.

DETAILED DESCRIPTIONS

Figure 1:
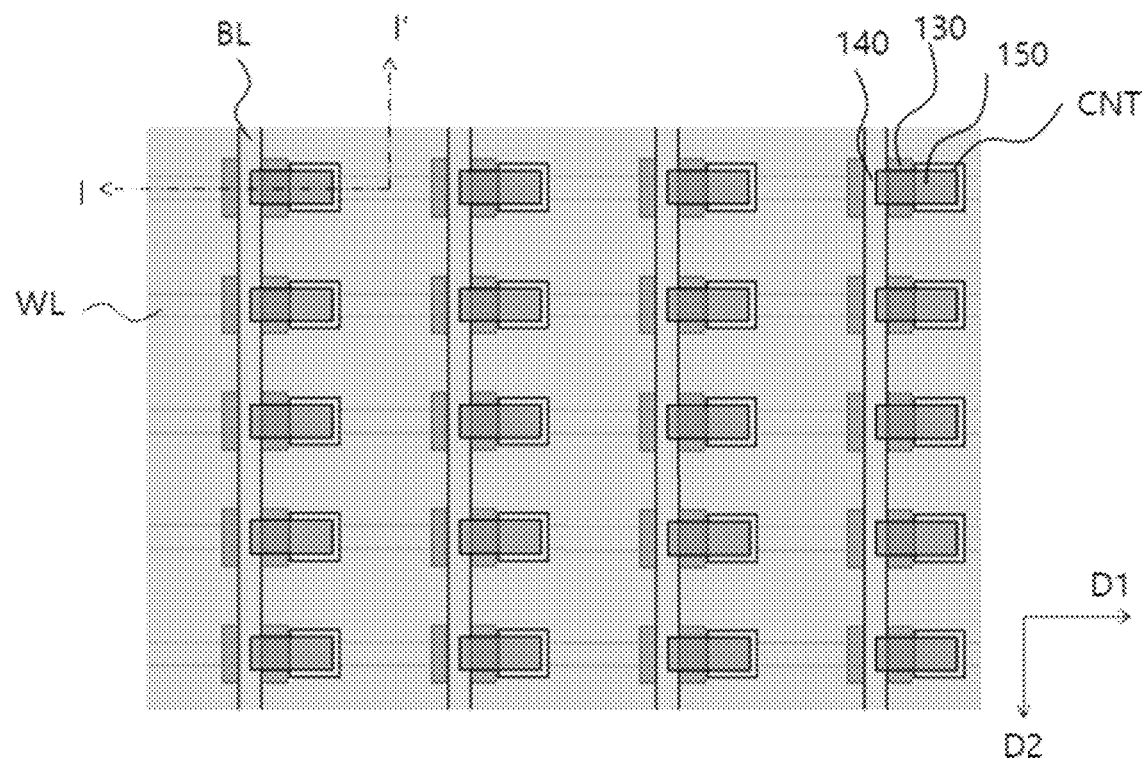
FIG. 1 is a top view of a structure of a vertical tunneling random access memory (TRAM) of a two-dimensional array according to the present disclosure.

For simplicity and clarity of illustration, elements in the figures are not necessarily drawn to scale. The same reference numbers in different figures denote the same or similar elements, and as such perform similar functionality. Also, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

Examples of various embodiments are illustrated and described further below. It will be understood that the description herein is not intended to limit the claims to the specific embodiments described. On the contrary, it is intended to cover alternatives, modifications, and equivalents as may be included within the spirit and scope of the present disclosure as defined by the appended claims.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "bound to", or "coupled to" another element or layer, it can be directly on, bound to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

Spatially relative terms, such as "beneath," "below," "lower," "under," "above," "upper," and the like, may be used herein for ease of explanation to describe one element or feature's relationship to another element s or feature s as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented for example, rotated 90 degrees or at other orientations, and the spatially relative descriptors used herein should be interpreted accordingly.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entire list of elements and may not modify the individual elements of the list.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In the following description, numerous specific details are set forth in order to provide a thorough understanding of the present disclosure. The present disclosure may be practiced without some or all of these specific details. In other instances, well-known process structures and/or processes have not been described in detail in order not to unnecessarily obscure the present disclosure.

A vertical direction in the present disclosure means a direction perpendicular to a surface of a base substrate. A horizontal direction in the present disclosure includes a first direction D1 and a second direction D2 in FIG. 1 and is perpendicular to the vertical direction.

Figure 2:
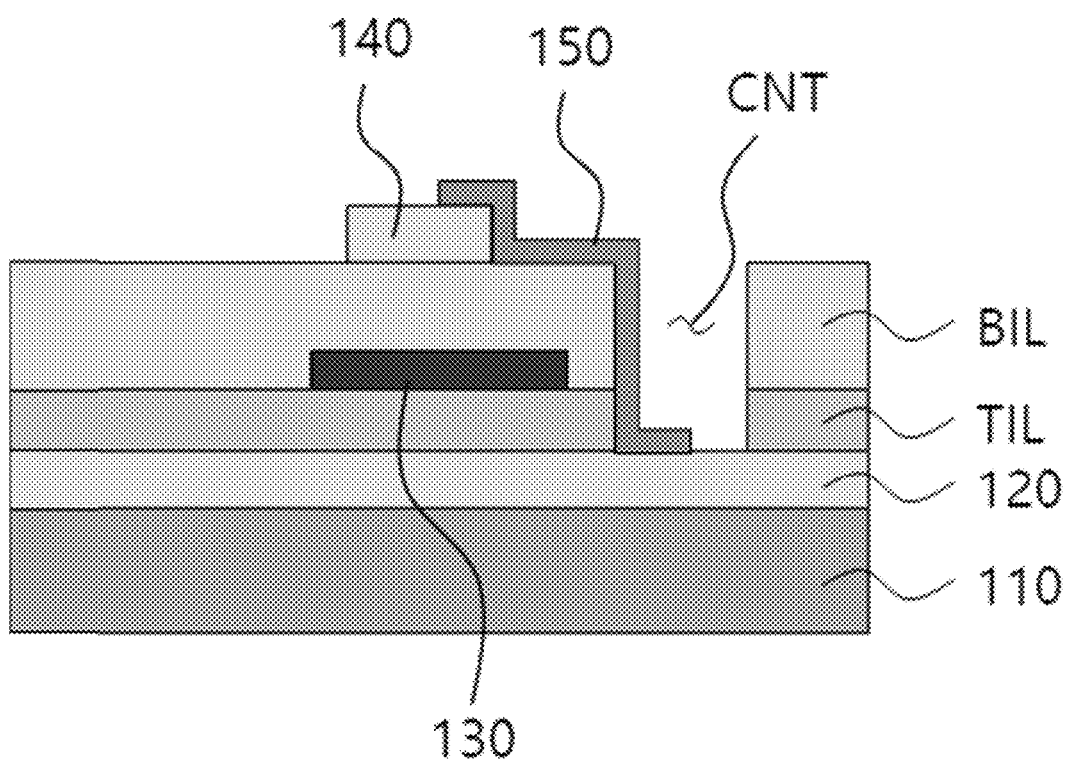
FIG. 2 is a cross-sectional view of a single semiconductor device cut along a line I-I' of FIG. 1.

FIG. 1 is a top view of a structure of a vertical tunneling random access memory (TRAM) of a two-dimensional array according to the present disclosure. FIG. 2 is a cross-sectional view of a single semiconductor device cut along a line I-I' of FIG. 1.

Referring to FIG. 1 and FIG. 2, the vertical TRAM according to the present disclosure includes a plurality of semiconductor devices disposed on a base substrate 110. Each of the semiconductor devices includes a first electrode 120 connected to a word line WL, a tunneling insulating layer TIL, a floating gate 130, a barrier insulating layer BIL, a second electrode 140 connected to a bit line BL, and a semiconductor pattern 150. The semiconductor devices are arranged in the first direction D1 and the second direction D2 intersecting the first direction D1 to form a matrix. In this connection, the second direction D2 may be a direction perpendicular to the first direction D1.

The base substrate 110 may be made of a stretchable material, for example, polyimide (PI) and/or polydimethylsiloxane (PDMS).

The word line WL extends in the first direction D1. A plurality of word lines WL are spaced apart from each other in the second direction D2. The bit line BL extends in the second direction D2. A plurality of bit lines BL are spaced from each other in the first direction D1. The first electrodes 120 of the semiconductor devices arranged in the first direction D1 are connected to each other via the word line WL. The second electrodes 140 of the semiconductor devices arranged in the second direction D2 are connected to each other via the bit line BL. Each of the word line WL, the first electrode 120, the bit line BL, and the second electrode 140 may be formed of a conductive metal layer. In one example, each of the word line WL, the first electrode 120, the bit line BL, and the second electrode 140 may have a double metal layer stack in which chromium and gold are sequentially stacked.

At an intersecting point between the word line WL and the bit line BL, the first electrode 120 and the second electrode 140 of the semiconductor device are disposed. Between the first electrode 120 and the second electrode 140, the tunneling insulating layer TIL, the floating gate 130, and the barrier insulating layer BIL are sequentially stacked. A contact hole CNT exposing a portion of the first electrode 120 is defined adjacent to the intersecting point. The semiconductor pattern 150 is disposed on the barrier insulating layer BIL. One end of the semiconductor pattern 150 is in direct contact with the second electrode 140 while the other end of the semiconductor pattern 150 directly contacts the first electrode 120 through the contact hole CNT.

The semiconductor pattern 150 provides a charge channel through which charges travel between the first electrode 120 and the second electrode 140. For example, the semiconductor pattern 150 may be made of molybdenum disulfide ($MoS_2$), tungsten diselenide ($WSe_2$), tungsten disulfide ($WS_2$), molybdenum diselenide ($MoSe_2$), silicon (Si), and germanium (Ge), zinc oxide (ZnO), indium-gallium-zinc oxide (IGZO), semiconducting carbon nanotubes (semiconducting CNT) and/or black phosphorous (BP) and the like.

The contact hole CNT has a through-hole structure passing through the tunneling insulating layer TIL and the barrier insulating layer BIL. The semiconductor pattern 150 extends from the second electrode 140 and then on and along a top face of the barrier insulating layer BIL and then on and along at least a portion of a side wall face of the contact hole CNT and eventually contacts the first electrode 120. In the semiconductor device having the semiconductor pattern 150 as a connector and having the cross-sectional structure of FIG. 2, an electric field from the floating gate 130 is simultaneously applied in the vertical direction and the horizontal direction of the semiconductor pattern 150. Since the first electrode 120 and the second electrode 140 are arranged in the vertical direction, the electrons may be injected into or removed from the floating gate 130 through the two electrodes. In this way, on/off states may be read by flowing a current through the semiconductor pattern 150. A plurality of semiconductor devices having such a structure are connected to each other to act as a flash memory.

The tunneling insulating layer TIL may be configured to enable charge tunneling through the tunneling insulating layer TIL. The tunneling insulating layer TIL may be made of a material having an insulating property while allowing the charge to tunnel through the tunneling insulating layer TIL by a voltage applied between the first electrode 120 and the second electrode 140. The tunneling insulating layer TIL is interposed between the first electrode 120 and the floating gate 130. An opening to expose the first electrode 120 is defined in the tunneling insulating layer TIL to define a portion of the contact hole CNT. For example, the tunneling insulating layer TIL may be made of hexagonal boron nitride (h-BN), aluminum oxide ($Al_2O_3$), hafnium oxide ($HfO_2$) and/or silicon nitride.

The floating gate 130 may be made of a material having conductivity and allowing charges uniformly to be distributed over an entire region thereof. For example, the floating gate 130 may be made of a metal or graphene. In a conventional floating gate memory (FGM), an operation to charge and discharge the floating gate 130 is carried out by a voltage applied to the gate electrode. However, the charging and discharging of the floating gate 130 in the TRAM according to the present disclosure may be performed by adjusting a voltage applied to the first electrode 120 and the word line WL.

After the floating gate 130 is formed on the tunneling insulating layer TIL, the barrier insulating layer BIL is formed to cover the floating gate 130 and the tunneling insulating layer TIL. The barrier insulating layer BIL has an opening in communication with the opening formed in the tunneling insulating layer TIL, thereby defining a corresponding portion of the contact hole CNT and exposing the first electrode 120. The barrier insulating layer BIL may be made of an insulating material. The barrier insulating layer BIL is thicker than the tunneling insulating layer TIL since the barrier insulating layer BIL has to serve as a barrier to confine electrons and holes.

FIG. 3 is an illustration of a vertical TRAM with a structure different from that of FIG. 1 and FIG. 2. FIG. 3a is a top view corresponding to FIG. 1. FIG. 3b is a cross-sectional view of a structure of a single semiconductor device of FIG. 3a.

In a structure of a semiconductor device of vertical TRAM shown in FIG. 3a and FIG. 3b, an etched side face of the second electrode 120 is substantially coincident with a side wall face of the contact hole CNT without a step between the second electrode 120 and the contact hole CNT. This is only a difference between the vertical TRAM shown in FIG. 3a and FIG. 3b and the vertical TRAM structure shown in FIG. 1 and FIG. 2. Therefore, overlapping descriptions therebetween are omitted.

In the vertical TRAM shown in FIGS. 3a and 3b, an electric field from the floating gate 130 is applied only in the vertical direction of the semiconductor pattern 150. As shown in FIG. 3b, there is no step between the second electrode 120 and the contact hole CNT while the semiconductor pattern 150 covers the side wall face of the contact hole CNT. An integration level of the semiconductor device in FIG. 3 may be relatively higher than that of the semiconductor device illustrated in FIG. 1 and FIG. 2.

Figure 6:
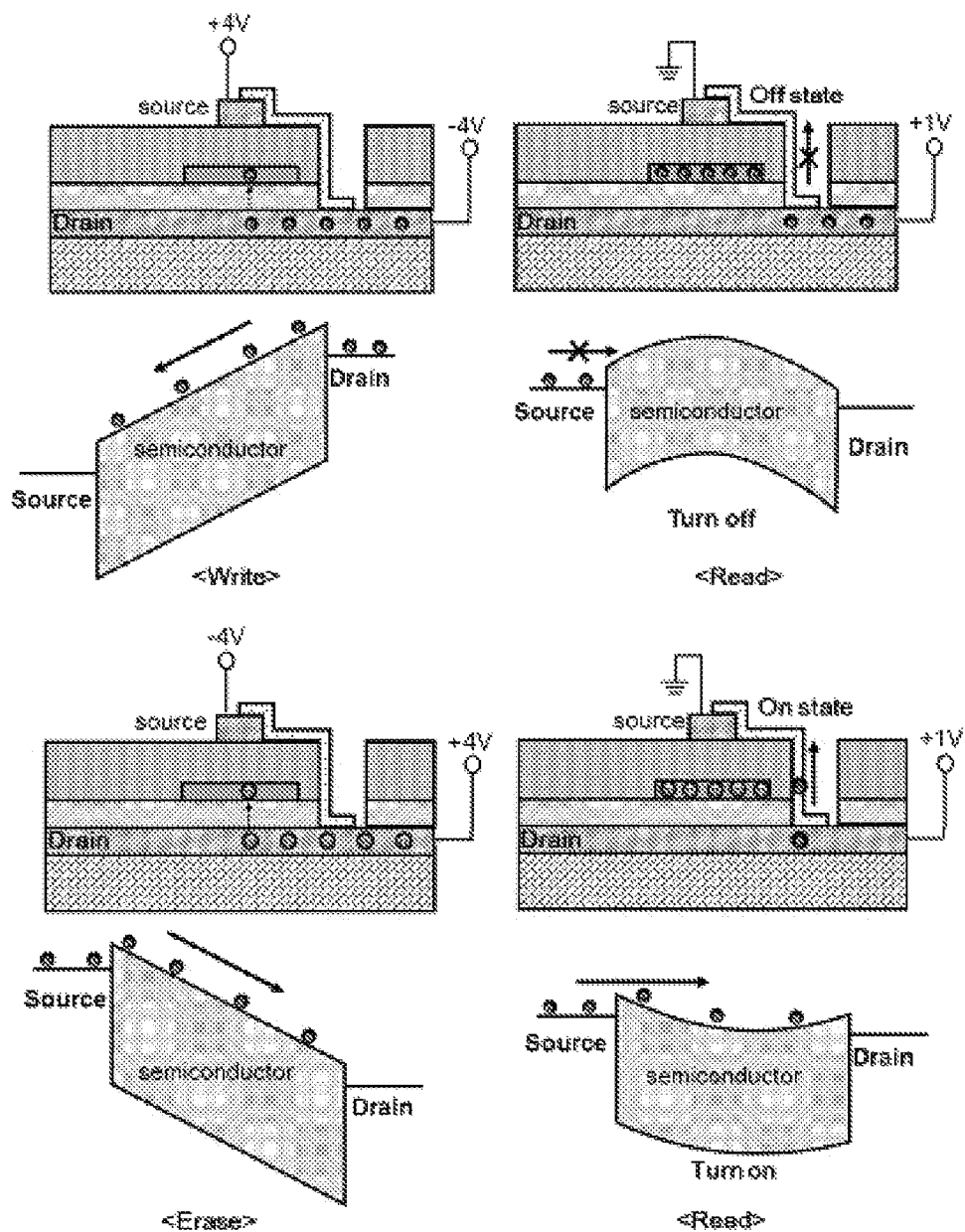
FIGS. 6 and 7 show an operation of a single semiconductor device according to the present disclosure.
Figure 7:
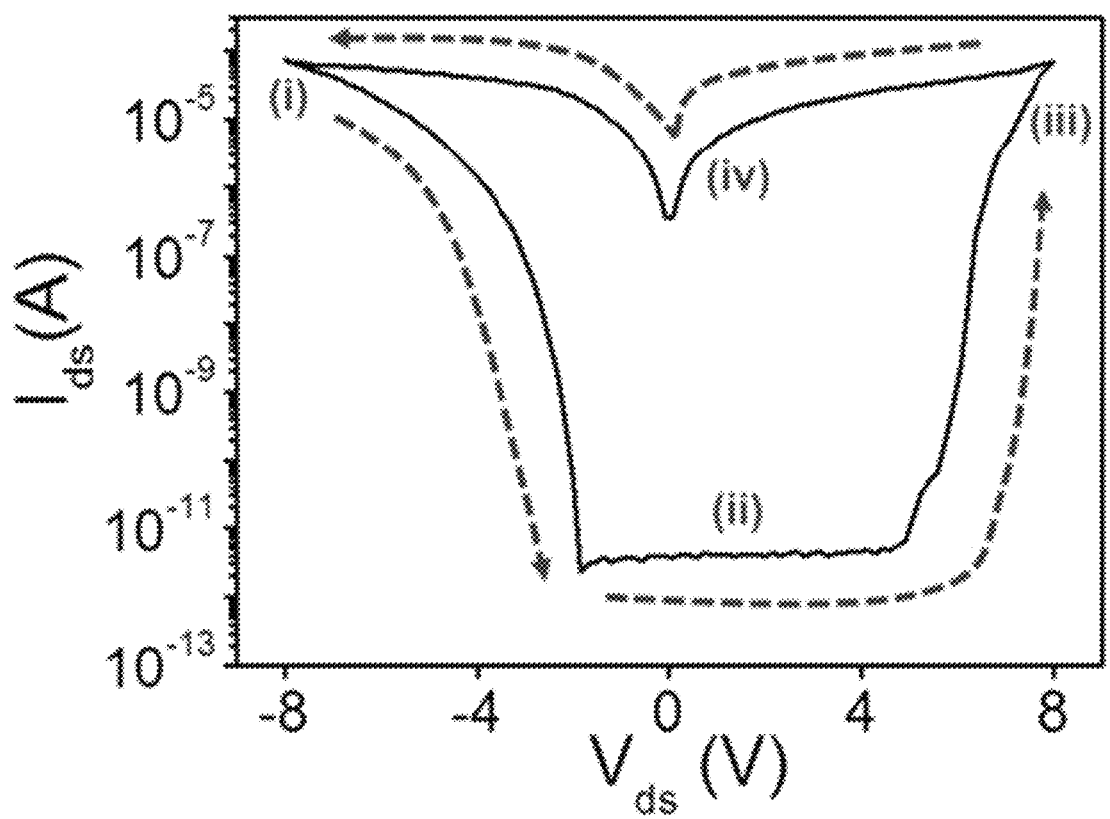
Figure 8:
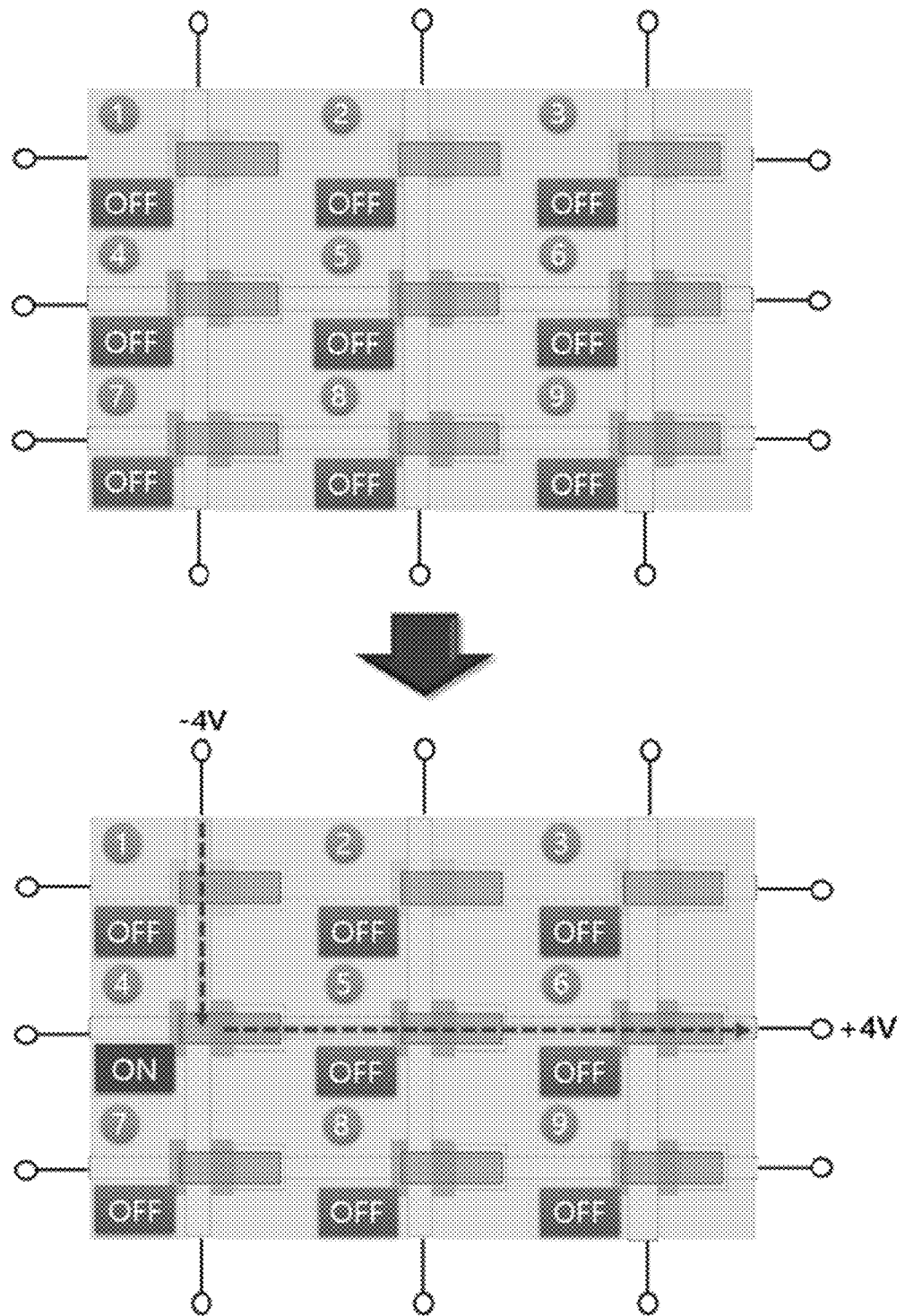
FIG. 8 illustrates a write operation process of the vertical TRAM of the two-dimensional array shown in FIG. 1.

Hereinafter, a method for manufacturing the vertical TRAM of FIG. 1 will be illustrated with reference to FIGS. 4 and 5. Referring to FIGS. 6 to 8, an operation of the vertical TRAM of FIG. 1 will be described. In this connection, descriptions of a manufacturing method and operation of the vertical TRAM illustrated in FIG. 3 may be substantially the same as the manufacturing method illustrated in FIGS. 4 to 5 and the operation illustrated in FIGS. 6 to 8. Thus, overlapping descriptions therebetween may be omitted.

Figure 4:
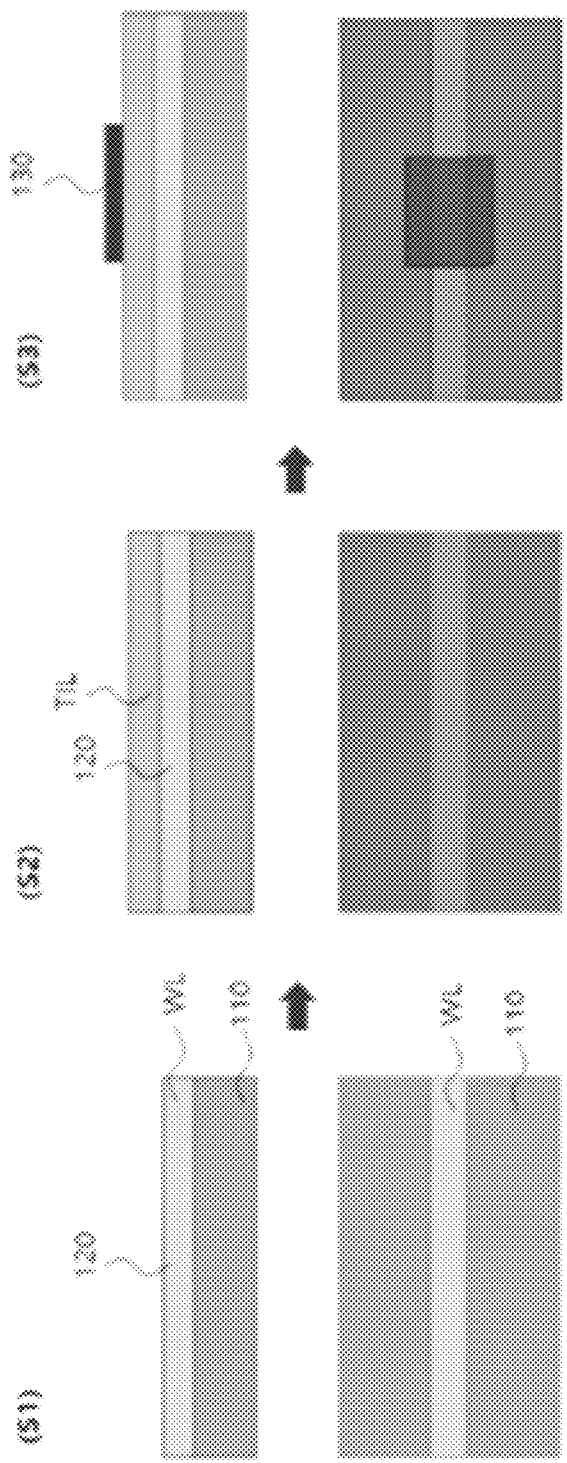
FIG. 4 and FIG. 5 are diagrams for illustrating a method of manufacturing the vertical TRAM illustrated in FIG. 1 and FIG. 2.
Figure 5:
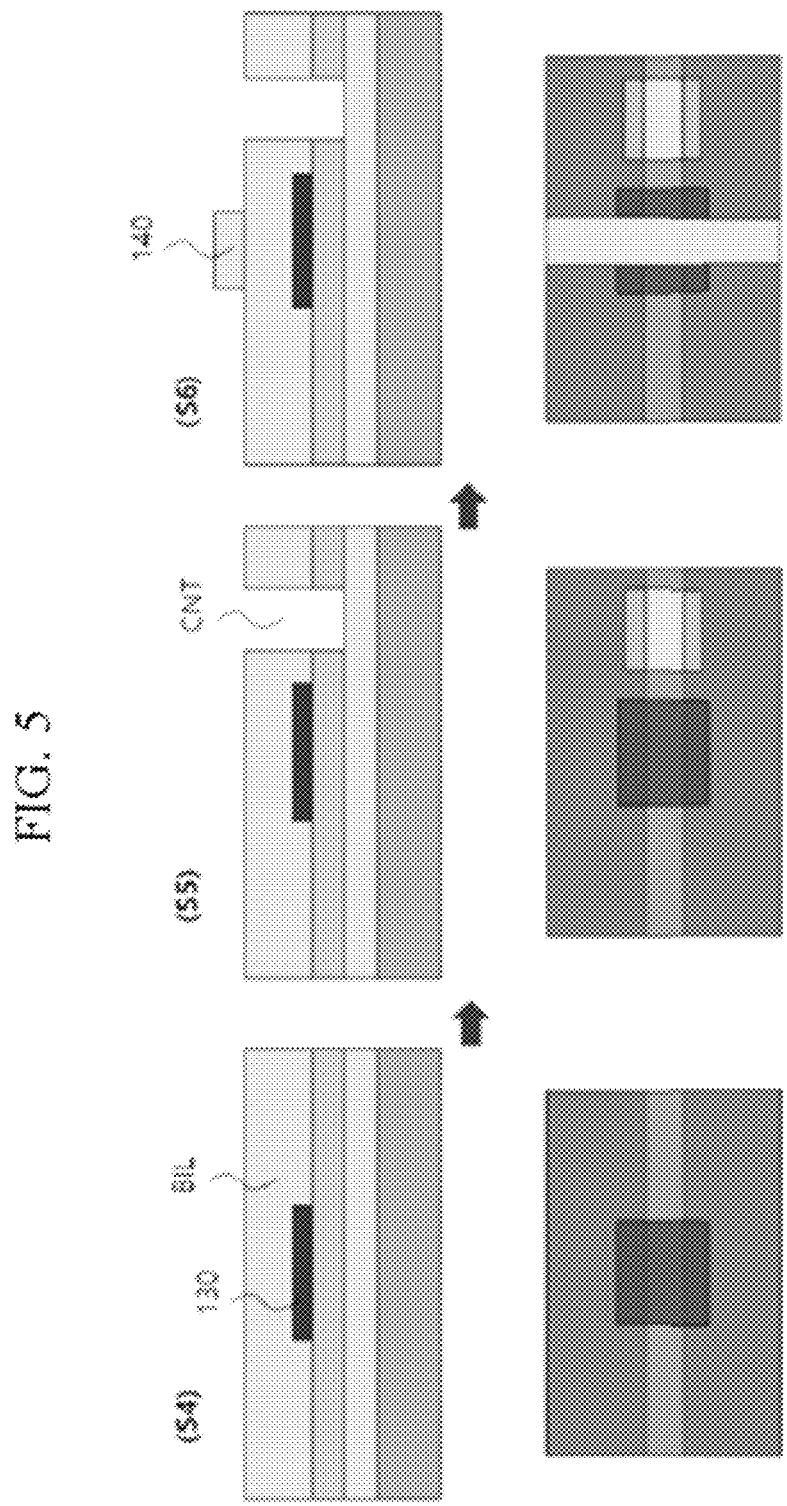

FIG. 4 and FIG. 5 are diagrams for illustrating the method for manufacturing the vertical TRAM illustrated in FIG. 1 and FIG. 2.

In FIG. 4 and FIG. 5, an upper diagram shows a cross-sectional view of an intermediate structure at each manufacturing step, and a lower diagram shows a top view thereof. The vertical TRAM according to the present disclosure is fabricated in an order of S1 to S3 of FIG. 4 and then S4 to S6 of FIG. 5. Further, reference numerals of the components of the structure shown in FIGS. 4 to 5 are based on FIG. 1 and FIG. 2.

Specifically, referring to Si in FIG. 4 together with FIG. 1 and FIG. 2, a metal layer (not shown) is first formed on the base substrate 110. The metal layer is patterned to form the word line WL and the first electrode 120. The patterning of the metal layer may be performed via a photolithography process.

Referring to S2 of FIG. 4, the tunneling insulating layer TIL is formed on the word line WL and the first electrode 120 formed on the base substrate 110. The tunneling insulating layer TIL may be formed using an atomic layer deposition (ALD) process.

Referring to S3 of FIG. 4, the floating gate 130 is formed on the tunneling insulating layer TIL formed on the base substrate 110. The floating gate 130 may be formed by transferring a graphene pattern onto the tunneling insulating layer TIL. Alternatively, the floating gate 130 may be formed by transferring a graphene layer onto the tunneling insulating layer TIL and patterning the transferred graphene layer. The floating gate 130 may be selectively formed at an intersecting point between the bit line BL and the word line WL.

Referring to S4 of FIG. 5, the barrier insulating layer BIL is formed on the floating gate 130 formed on the base substrate 110. The barrier insulating layer BIL may be formed via a chemical vapor deposition CVD process. The barrier insulating layer BIL may be thicker than the tunneling insulating layer TIL.

Referring to S5 of FIG. 5, after the barrier insulating layer BIL is formed, the contact hole CNT exposing the first electrode 120 is formed at a location adjacent to a region where the floating gate 130 is formed. To this end, the barrier insulating layer BIL and the tunneling insulating layer TIL are partially removed in a region where the floating gate 130 is not formed.

Referring to S6 of FIG. 5, after the contact hole CNT is formed, the bit line BL and the second electrode 140 are formed. The bit line BL and the second electrode 140 may be formed by forming a metal layer and patterning the metal layer.

Referring to S6 in FIG. 5 together with FIG. 1 and FIG. 2, after forming the bit line BL and the second electrode 140, the semiconductor pattern 150 connecting the first electrode 120 and the second electrode 140 through the contact hole CNT is transferred. Accordingly, substantially the same vertical TRAM as that illustrated in FIG. 1 and FIG. 2 may be fabricated.

FIGS. 6 and 7 illustrate an operation of a single semiconductor device according to the present disclosure.

FIG. 6 shows write, read, erase and read operations of the semiconductor device shown in FIG. 1 and FIG. 2. FIG. 7 shows the operation of the single semiconductor device using a voltage-current graph.

Referring to FIG. 6 together with FIG. 2, in a write operation, a negative voltage is applied to the first electrode 120, which is a drain electrode, while a positive voltage is applied to the second electrode 140, which is a source electrode. As a result, upon being affected by a strong electric field, electrons may tunnel through the tunneling insulating layer TIL toward the floating gate 130. Thus, the electrons are trapped in the floating gate 130 by the barrier insulating layer BIL and are accumulated sequentially in the gate 130. As a result, the semiconductor pattern 150 is subjected to a negative electric field effect resulting from the electrons stored in the floating gate 130, and thus is brought into a high resistance state. Thus, in a read operation, when the second electrode 140 is grounded, and a read voltage is applied to the first electrode 120, a current may not flow in the semiconductor pattern to have an off state of '0'.

Conversely, in a case of an erase operation, a positive voltage is applied to the first electrode 120, and a negative voltage is applied to the second electrode 140. As a result, holes tunnel through the tunneling insulating layer TIL toward the floating gate 130. The holes are accumulated in the gate 130. The semiconductor pattern 150 has a low resistance due to the positive field effect caused by the holes accumulated in the floating gate 130. Thus, in a read operation, the second electrode 140 is grounded and the read voltage is applied to the first electrode 120. This allows a high current to flow in the semiconductor pattern 150. Thus, the semiconductor device may have an on state '1'.

The operation shown in FIG. 6 may be confirmed using the voltage-current graph in FIG. 7. First, electrons are accumulated in the floating gate 130 by a high negative voltage applied in a (i) phase. In a (ii) phase when a low voltage is applied, the semiconductor device exhibits a very low current value since the device is in an off state.

In a (iii) phase, a high positive voltage is applied. Thus, instead of the electrons, holes are accumulated in the floating gate 130. As a result, in a (iv) phase, the device is turned on and a very high current flows therein.

The on/off states correspond to bit '0' or '1', and, thus, the present semiconductor device performs a memory function. Electrons and holes accumulated in the floating gate 130 cannot escape out of the gate 130 due to the barrier insulating layer BIL during the read operation. Thus, the on/off states may be stored for a long time. Accordingly, the TRAM having the structure shown in FIG. 2 or FIG. 3 according to the present disclosure may serve as a non-volatile memory.

FIG. 8 shows a write operation of the vertical TRAM of the two-dimensional array shown in FIG. 1.

Referring to FIG. 8, in order that, among nine cells #1 to #9, a state of the #4 cell is switched from an off state to an on state, +4 V and −4 V are applied to both terminals connected to the #4 cell, respectively while remaining terminals remain in a floating state. In this connection, a voltage of (8 V) enough to accumulate holes is not applied to the cells except the cell #4. The voltage sufficient to accumulate holes is applied to the cell #4. Thus, holes are accumulated in the floating gate. Thus, the semiconductor pattern is turned on and current flows therein. Conversely, when −4V and +4V are applied to the both terminals, the electrons are accumulated in the floating gate such that the semiconductor pattern is brought into the off state.

As described above, a vertical direction spacing of 20 nm or smaller is defined between the first electrode 120 and the second electrode 140. As a result, a driving voltage of the memory is drastically reduced while an operation reliability of the semiconductor device and an operation reliability of the nonvolatile memory may be secured.

Figure 9:
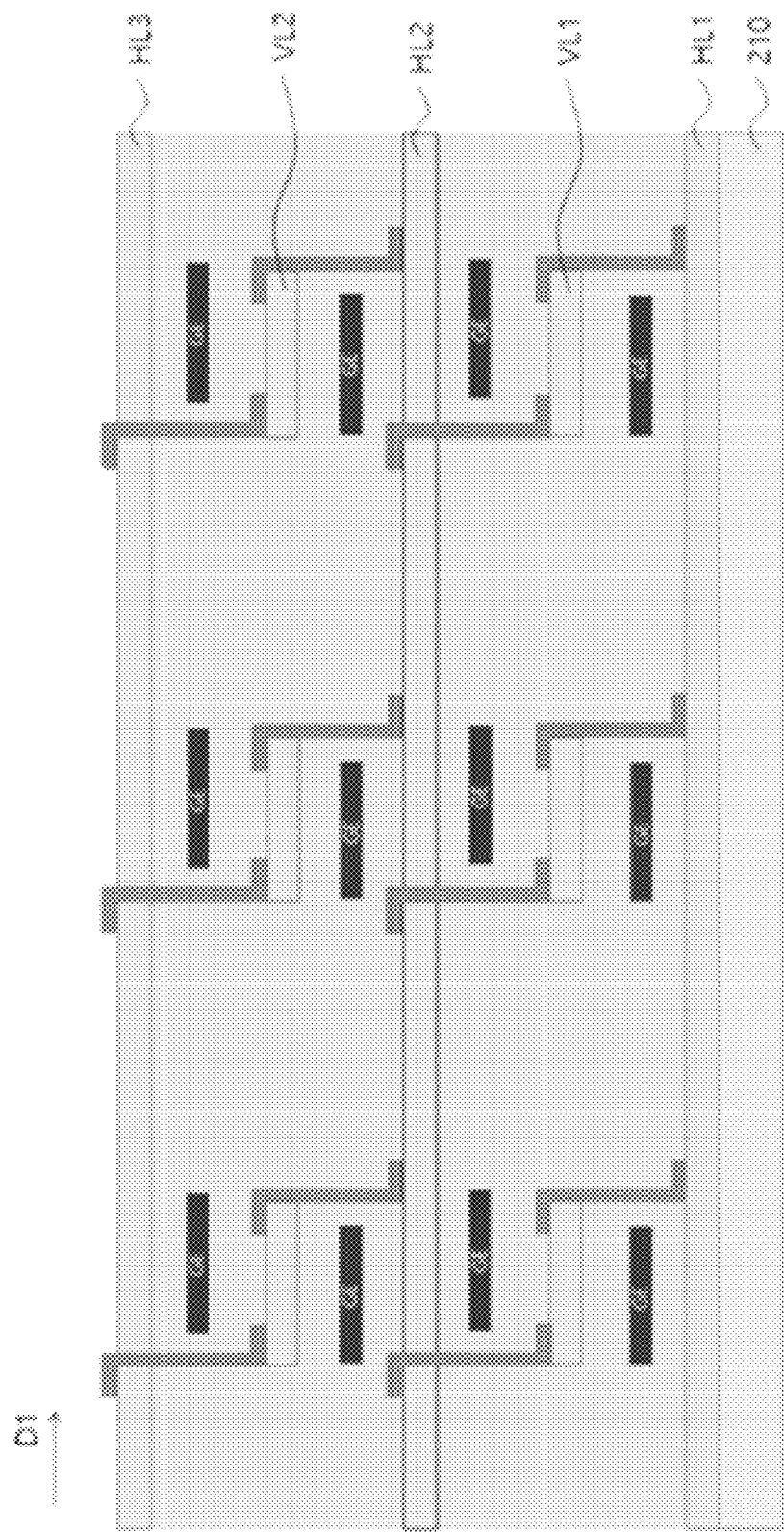
FIGS. 9 and 10 illustrate other structures of a vertical TRAM of a three-dimensional array according to the present disclosure.
Figure 10:
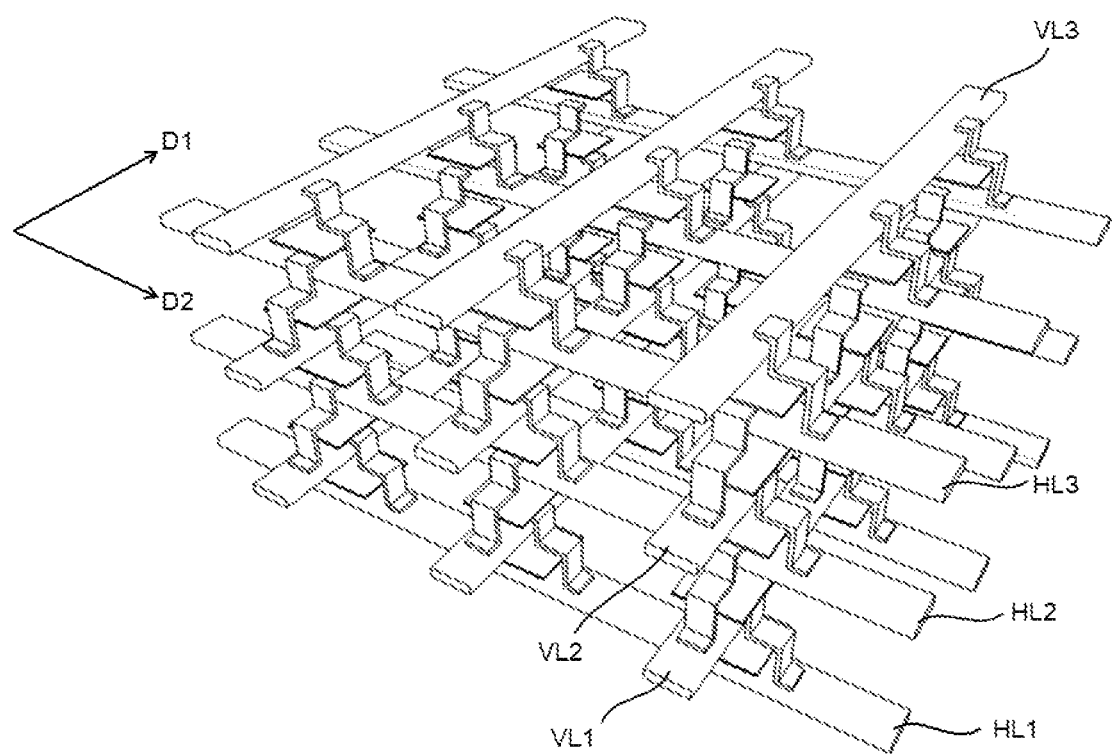

FIGS. 9 and 10 illustrate other structures of a vertical TRAM of a three-dimensional array according to the present disclosure.

Referring to FIG. 9 together with FIG. 1, at least two of the two-dimensional arrays with the matrix structure in which the semiconductor devices illustrated in FIG. 1 and FIG. 2 are arranged in the first direction D1 and the second direction D2 may be stacked in a vertical direction perpendicular to a plane defined by the first and second directions D1 and D2 to form a vertical TRAM of a three-dimensional array.

Referring to the cross-sectional structure, each of first first-direction extending electrode lines HL1 extends in the first direction D1 of the base substrate 210. Each of second first-direction extending electrode lines HL2 and each of third first-direction extending electrode lines HL3 are sequentially stacked so as to be insulated from and overlapped with the first first-direction extending electrode line HL1 in the vertical direction. In this connection, each of first second-direction extending electrode lines VL1 is disposed between corresponding first and second first-direction extending electrode lines HL1 and HL2 so as to be insulated from the first and second first-direction extending electrode lines HL1 and HL2 and extends in the second direction D2 perpendicular to the first direction D1. Further, each of second second-direction extending electrode lines VL2 is disposed between corresponding second and third first-direction extending electrode lines HL2 and HL3 so as to be insulated from the second and third first-direction extending electrode lines HL2 and HL3 and extends in the second direction D2 perpendicular to the first direction D1.

In this connection, at each of intersection regions between the corresponding first to third first-direction extending electrode lines HL1, HL2 and HL3 and the corresponding first and second second-extending extending electrode lines VL1 and VL2, a corresponding floating gates GE is disposed. The tunneling insulating layer illustrated in FIG. 2 is interposed between each of the first to third first-direction extending electrode lines HL1, HL2, and HL3 and each of the floating gates GE to insulate between each of the first to third first-direction extending electrode lines HL1, HL2, and HL3 and each of the floating gates GE. The barrier insulating layer illustrated in FIG. 2 is interposed between each of the floating gates GE and each of the first and second second-direction extending electrode lines VL1 and VL2 to insulate between each of the floating gates GE and each of the first and second second-direction extending electrode lines VL1 and VL2.

In this connection, the first-direction extending electrode line and the second-direction extending electrode line sandwiching one floating gate are in contact with both ends of the semiconductor pattern respectively. As a result, the semiconductor pattern becomes a current channel. The semiconductor pattern extends through the contact hole CNT shown in FIG. 2 to connect the first-direction extending electrode line and the second-direction extending electrode line, which face away each other. Although the contact hole CNT is not shown in FIG. 9, the contact hole CNT is provided.

The first first-direction extending electrode line HL1, the first second-extending extending electrode line VL1, and the first floating gate GE therebetween operates as one semiconductor device when the first first-direction extending electrode line HL1 receive a drain voltage and becomes a drain and the source voltage is applied to the first second-direction extending electrode line VL1. Further, the first second-direction extending electrode line VL1, the second first-extending extending electrode line HL2, and the floating gate GE therebetween operate as one semiconductor device when the first second-direction extending electrode line VL1 receives a drain voltage and becomes a drain and the source voltage is applied to the second first-direction extending electrode line HL2. In other words, the two-dimensionally arrayed semiconductor devices as shown in FIG. 1 and FIG. 2 may be stacked in a vertical direction while sharing electrodes. FIG. 9 illustrates an example of a structure in which four semiconductor devices are stacked in a vertical direction. However, the present disclosure is not limited thereto. At least two or more semiconductor devices are stacked. A stack structure of five or more semiconductor devices may be implemented. When the manufacturing process proceeds in this manner, the production cost reduction of the semiconductor devices may be achieved, and the degree of integration thereof will be greatly improved due to the above structure. Thus, when the tunneling random access memory has the three-dimensional structure, the present device may be advantageous in terms of the integration degree of the semiconductor device and the production cost thereof.

Referring to FIG. 10, an array and stacking structure of the first to third first-direction extending electrode lines HL1, HL2, HL3 and first and second second-extending extending electrode lines VL1, VL2 are substantially the same as those illustrated in FIG. 9 except for the location of the semiconductor pattern. That is, varying semiconductor devices may be defined with varying the location of the semiconductor pattern. That is, in FIG. 9, two semiconductor patterns coupled to one electrode line shared by two semiconductor devices are spaced from each other in the first direction D1 and have a 180 degrees rotational relationship in a position. In FIG. 10, two semiconductor patterns coupled to one electrode line shared by two semiconductor devices are spaced from each other in the second direction D2 and have a 90 degrees rotational relationship in a position.

While the present disclosure has been described with reference to preferred embodiments, those skilled in the art will appreciate that the present disclosure may be variously modified and changed without departing from the spirit and scope of the present disclosure set forth in the following claims.

What is claimed is:

1. A vertical tunneling random access memory comprising:
   a first electrode disposed on a base substrate;
   a second electrode vertically spaced from the first electrode;
   a floating gate disposed between the first electrode and the second electrode and configured to charge or discharge charges;
   a tunneling insulating layer disposed between the first electrode and the floating gate;
   a barrier insulating layer disposed between the floating gate and the second electrode;
   a contact hole passing through the tunneling insulating layer and the barrier insulating layer for partially exposing the first electrode; and
   a semiconductor pattern extending from the second electrode, along and on a portion of a side wall face defining the contact hole, to the first electrode such that one end of the semiconductor pattern is in contact with the first electrode and the other end of the pattern is in contact with the second electrode.

2. The vertical tunneling random access memory of claim 1, wherein the barrier insulating layer is thicker than the tunneling insulating layer such that electrons resulting from an application of a voltage to the first electrode tunnel through the tunneling insulating layer to the floating gate and are accumulated in the floating gate.

3. The vertical tunneling random access memory of claim 1, wherein a vertical spacing between the second electrode and the first electrode is smaller than or equal to 20 nm.

4. The vertical tunneling random access memory of claim 1, wherein in a write mode, a resistance of the semiconductor pattern is higher than a resistance of the semiconductor pattern in an erase mode due to a negative field effect from electrons accumulated in the floating gate by a negative voltage applied to the first electrode and a positive voltage applied to the second electrode,
   wherein in a read mode, the memory is brought into an off state.

5. The vertical tunneling random access memory of claim 4, wherein in the erase mode, the resistance of the semiconductor pattern is lower than the resistance of the semiconductor pattern in the write mode due to a positive field effect from holes accumulated in the floating gate by a positive voltage applied to the first electrode and a negative voltage applied to the second electrode,
   wherein in the read mode, the memory is brought into an on state.

6. The vertical tunneling random access memory of claim 1, further comprising word lines each of which extends in a first direction and bit lines each of which extends in a second direction crossing the first direction, wherein the word lines are arranged in the second direction and the bit lines are arranged in the first direction,
   wherein each first electrode, each second electrode, and each floating gate are disposed in each of intersecting regions between the word lines and the bit lines,
   wherein corresponding first and second electrodes are connected via a corresponding semiconductor pattern,
   wherein each first electrode is connected to each word line and acts as each drain electrode, and each second electrode is connected to each bit line and acts as each source electrode.

7. The vertical tunneling random access memory of claim 1, wherein the semiconductor pattern is made of one selected from a group consisting of molybdenum disulfide ($MoS_2$), tungsten diselenide ($WSe_2$), tungsten disulfide ($WS_2$), molybdenum diselenide ($MoSe_2$), silicon (Si), and germanium (Ge), zinc oxide (ZnO), indium-gallium-zinc oxide (IGZO), semiconducting carbon nanotubes (semiconducting CNT) and black phosphorous (BP).

8. The vertical tunneling random access memory of claim 1, wherein the tunneling insulating layer is made of one selected from a group consisting of hexagonal boron nitride (h-BN), aluminum oxide ($Al_2O_3$), hafnium oxide ($HfO_2$) and silicon nitride.

9. The vertical tunneling random access memory of claim 1, wherein the floating gate is made of graphene.

10. A vertical tunneling random access memory comprising:
- a base substrate, wherein a horizontal plane of the base substrate is defined by a first direction and a second direction perpendicular to the first direction;
- first-direction extending electrode lines, wherein each of the first-direction extending electrode lines extends in the first direction, and the first-direction extending electrode lines are spacedly and vertically stacked;
- second-direction extending electrode lines, wherein each of the second-direction extending electrode lines extends in the second direction, and the second-direction extending electrode lines are spacedly and vertically stacked, wherein a corresponding second-direction extending electrode line is disposed between corresponding adjacent two first-direction extending electrode lines; and
- semiconductor devices, wherein each semiconductor device is disposed in an intersecting region between vertically adjacent first-direction extending and second-direction extending electrode lines,
- wherein each semiconductor device includes:
- a first electrode coupled to one of the vertically adjacent first-direction extending and second-direction extending electrode lines, wherein the one of the vertically adjacent first-direction extending and second-direction extending electrode lines has a lower vertical level than the other of the vertically adjacent first-direction extending and second-direction extending electrode lines;
- a second electrode vertically spaced from the first electrode, wherein the second electrode is coupled to the other of the vertically adjacent first-direction extending and second-direction extending electrode lines;
- a floating gate disposed between the first electrode and the second electrode and configured to charge or discharge charges;
- a tunneling insulating layer disposed between the first electrode and the floating gate;
- a barrier insulating layer disposed between the floating gate and the second electrode;
- a contact hole passing through the tunneling insulating layer and the barrier insulating layer for partially exposing the first electrode;
- a semiconductor pattern extending from the second electrode, along and on a portion of a side wall face defining the contact hole, to the first electrode such that one end of the semiconductor pattern is in contact with the first electrode and the other end of the pattern is in contact with the second electrode.

11. The vertical tunneling random access memory of claim 10, wherein vertically adjacent two first-direction extending electrode lines and a single second-direction extending electrode line between the vertically adjacent two first-direction extending electrode lines constitute two semiconductor devices sharing the single second-direction extending electrode line.

12. The vertical tunneling random access memory of claim 10, wherein a plurality of first-direction extending electrode lines are arranged in the second direction, and a plurality of second-direction extending electrode lines are arranged in the first direction, the semiconductor devices are arranged in a 3D configuration.

* * * * *